United States Patent [19]

Hasegawa

[11] Patent Number: 4,587,482
[45] Date of Patent: May 6, 1986

[54] DIGITAL FREQUENCY METER FOR MEASURING RADIATION

[75] Inventor: Masakoto Hasegawa, Ono, Japan

[73] Assignee: Mitsubishi Denki Kabushiki Kaisha, Tokyo, Japan

[21] Appl. No.: 519,733

[22] Filed: Aug. 2, 1983

[51] Int. Cl.[4] ............................................. G01R 23/02
[52] U.S. Cl. .............................. 324/78 D; 324/79 D; 328/140
[58] Field of Search ............... 324/78 D, 78 R, 79 D, 324/79 R; 328/140, 141; 377/29, 44, 45, 49, 19; 364/484; 250/336.1

[56] References Cited

U.S. PATENT DOCUMENTS 2,951,202  8/1960  Gordon ................................ 377/45
3,578,960  5/1971  Georgi ................................. 377/19
4,020,418  4/1977  Burrage ............................ 324/79 D
4,414,678 11/1983  Baumgartner ....................... 377/45

OTHER PUBLICATIONS

"Microcomputer Applications in Nuclear Power Plants", subtitled Radiation Monitoring System by James W. Rowland, IEEE May 1980, pp. 59-60, and 63.
"Recent Developments in In-Plant Radiation Monitoring", subtitled Signal Processing by Distributed Microcomputer Data Modules by Charles H. Griesaker et al., Tausao vol. 28, pp. 639-641.

Primary Examiner—Stewart J. Levy
Assistant Examiner—Robert R. Raevis
Attorney, Agent, or Firm—Leydig, Voit & Mayer, Ltd.

[57] ABSTRACT

The present invention relates to a digital frequency meter for measuring radiation comprising a first up/down counter which algebrically integrates frequency differences between pulses to-be-measured and feedback pulses derived from a clock generator, a second up/down counter which is connected in cascade to the first up/down counter, an arithmetic circuit which provides as its output a value proportional to an output of the second up/down counter, and a frequency generator circuit which generates the feedback pulses at a frequency proportional to the output of the arithmetic circuit, all the above constituents forming a closed loop, so that in measuring a frequency of the pulses to-be-measured from an equilibrium point of the closed loop, the output of the arithmetic circuit is rendered proportional to an input thereof, whereby a product between the frequency of the pulses to-be-measured and a time constant of the frequency meter becomes constant.

2 Claims, 7 Drawing Figures

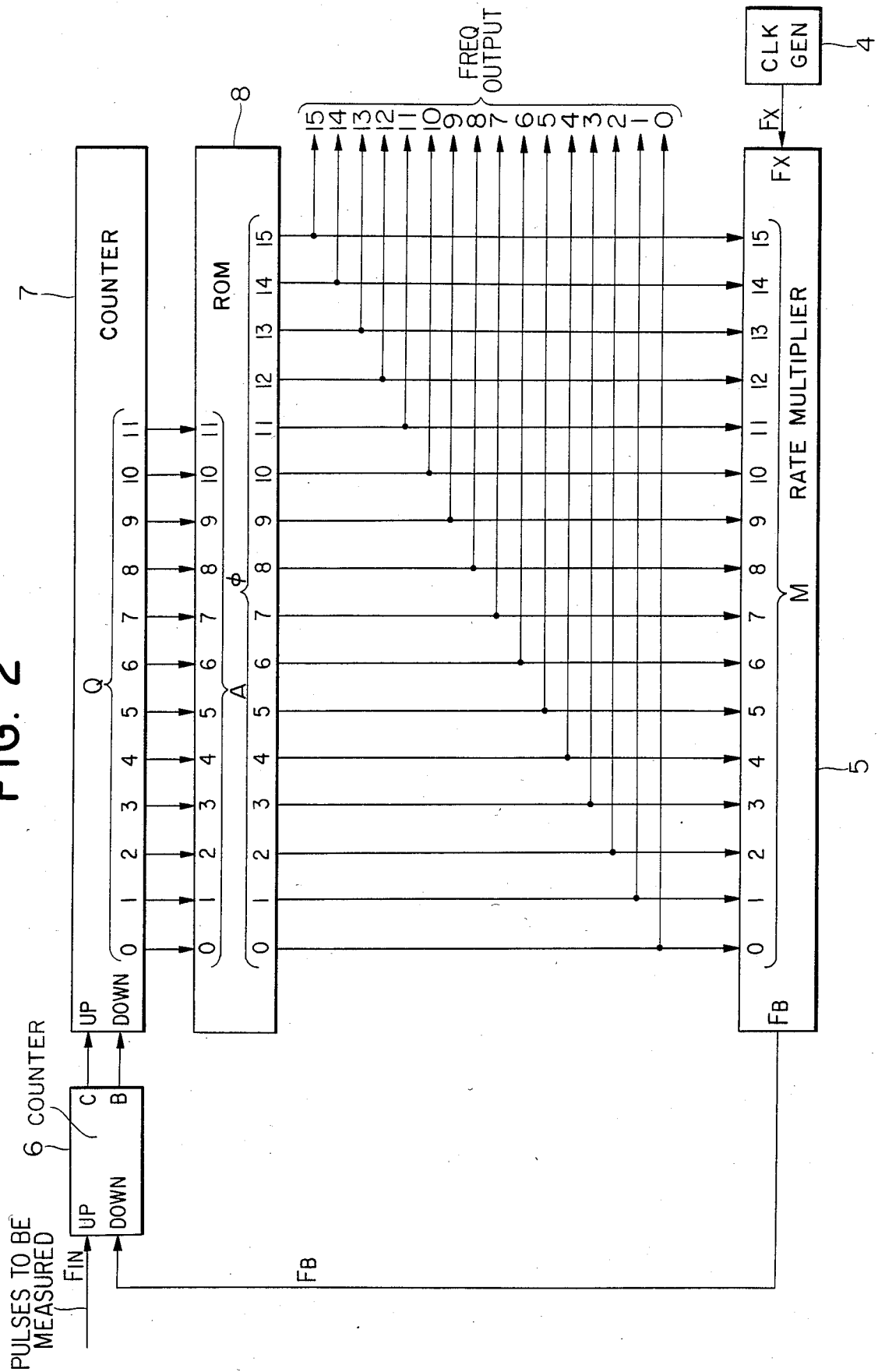

FIG. 3

| M | | | | | | | | | | | | | | | | FB | Fx |
|15|14|13|12|11|10|9|8|7|6|5|4|3|2|1|0|---|---|
|0|0|0|0|0|0|0|0|0|0|0|0|0|0|0|0|0|65536|
|0|0|0|0|0|0|0|0|0|0|0|0|0|0|0|1|1| |
|0|0|0|0|0|0|0|0|0|0|0|0|0|0|1|0|2| |
|0|0|0|0|0|0|0|0|0|0|0|0|0|1|0|0|4| |
|0|0|0|0|0|0|0|0|0|0|0|0|1|0|0|0|8| |
|0|0|0|0|0|0|0|0|0|0|0|1|0|0|0|0|16| |
|0|0|1|0|0|0|0|0|0|0|0|0|0|0|0|0|8192| |
|0|1|0|0|0|0|0|0|0|0|0|0|0|0|0|0|16384| |
|1|0|0|0|0|0|0|0|0|0|0|0|0|0|0|0|32768| |
|1|1|1|1|1|1|1|1|1|1|1|1|1|1|1|1|65535|▼|

FIG. 4

| ADDRESS INPUT A | DATA OUTPUT $\phi$ |
|---|---|
| 0 | 1 |
| 1 | 1 |
| 2 | 1 |
| 4 | 1 |
| 8 | 1 |
| 16 | 1 |
| 32 | 1 |
| 64 | 1 |
| 128 | 1 |
| 256 | 2 |
| 512 | 4 |
| 1024 | 16 |
| 2048 | 256 |
| 3072 | 4104 |
| 4095 | 65535 | ature of 16 bits. The output pulses of
DIGITAL FREQUENCY METER FOR MEASURING RADIATION

BACKGROUND OF THE INVENTION

This invention relates to a digital frequency meter for use in radiation monitors which are installed in a nuclear power station, etc.

A prior-art apparatus of this type has been as illustrated in FIGS. 1A and 1B. In FIG. 1A, numeral 1 designates a present counter, numeral 2 a timer, and numeral 3 a computer.

Pulses to be measured are applied to the present counter 1, and are counted to a present number (denoted by N). The timer 2 measures the period of time (denoted by T) taken for the preset counter 1 to count the N pulses to-be-measured.

The quantities N and T are inputted to the computer 3, and the frequency of the pulses to-be-measured is obtained via the following calculation:

$$\text{Frequency} = \frac{N}{T}$$

FIG. 1B shows an example of the operating waveforms of the apparatus shown in FIG. 1A. The computer 3 generates a measurement start pulse $P_{START}$ at a time $t_{s1}$. This pulse $P_{START}$ resets the preset counter 1 and the timer 2 into the initial statuses thereof. Thenceforth, the preset counter 1 counts the pulses to-be-measured, and the timer 2 counts reference time pulses (not shown), to increase their count values. When the count content of the preset counter 1 has reached the preset value N at time $t_{E1}$, this preset counter generates a measurement end pulses $P_{END}$. This pulse $P_{END}$ stops the counting operation of the timer 2, and informs the computer 3 of the end of the measurement. Upon receiving the pulse $P_{END}$, the computer 3 executes a series of operations including the loading of the count value $T_1$ of the timer 2, the calculation of the frequency, the updating of the frequency output, and the generation of the measurement start pulse $P_{START}$ at a time $t_{s2}$.

By repeating the above operations, the frequency of the pulses to-be-measured is measured.

Since the prior-art digital frequency meter is constructed and operated as described above, it requires the counter for counting the pulses to-be-measured and the timer having a dynamic range equivalent, at least, to that of the rate of the pulses to-be-measured and the division is necessary within the computer. Another disadvantage is that the frequency which is outputted every cycle of sampling changes discontinuously. Particularly in case of a low frequency, the sampling cycle becomes long, and the discontinuous change of the frequency to be outputted every sampling cycle is unfavorable for the radiation monitor for which the monitoring of the slow variation of a radiation level is also important.

SUMMARY OF THE INVENTION

This invention has been made in order to eliminate the disadvantages of the prior-art apparatus as described above, and has for its object to provide a digital frequency meter whose frequency output changes continuously and whose statistical error becomes constant.

BRIEF DESCRIPTION OF THE DRAWINGS

FIG. 1A is a block diagram showing the arrangement of a prior-art digital frequency meter, while

FIG. 2 is a block diagram showing the arrangement of a digital frequency meter according to an embodiment of this invention;

FIG. 3 is a table showing the input/output characteristics of a rate multiplier in the embodiment;

FIG. 4 is a table showing the input/output characteristics of a ROM in the embodiment;

DESCRIPTION OF THE PREFERRED EMBODIMENT

Figure 1A:
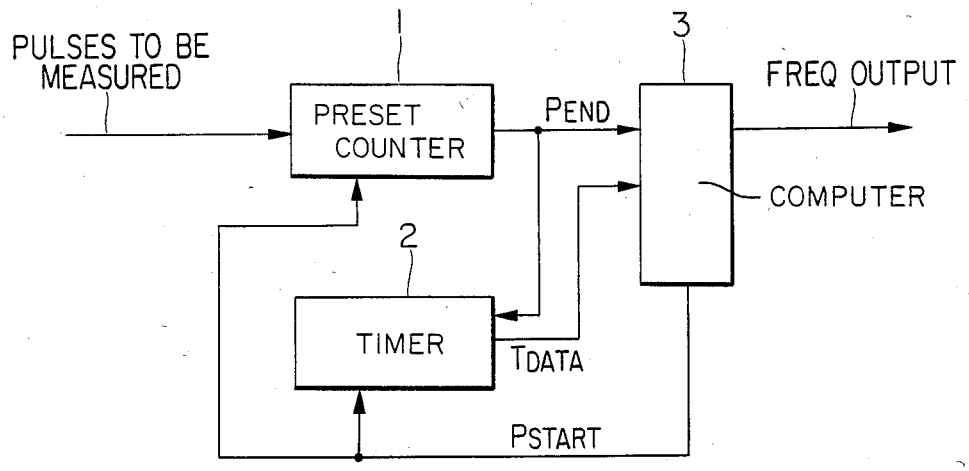
Figure 1B:
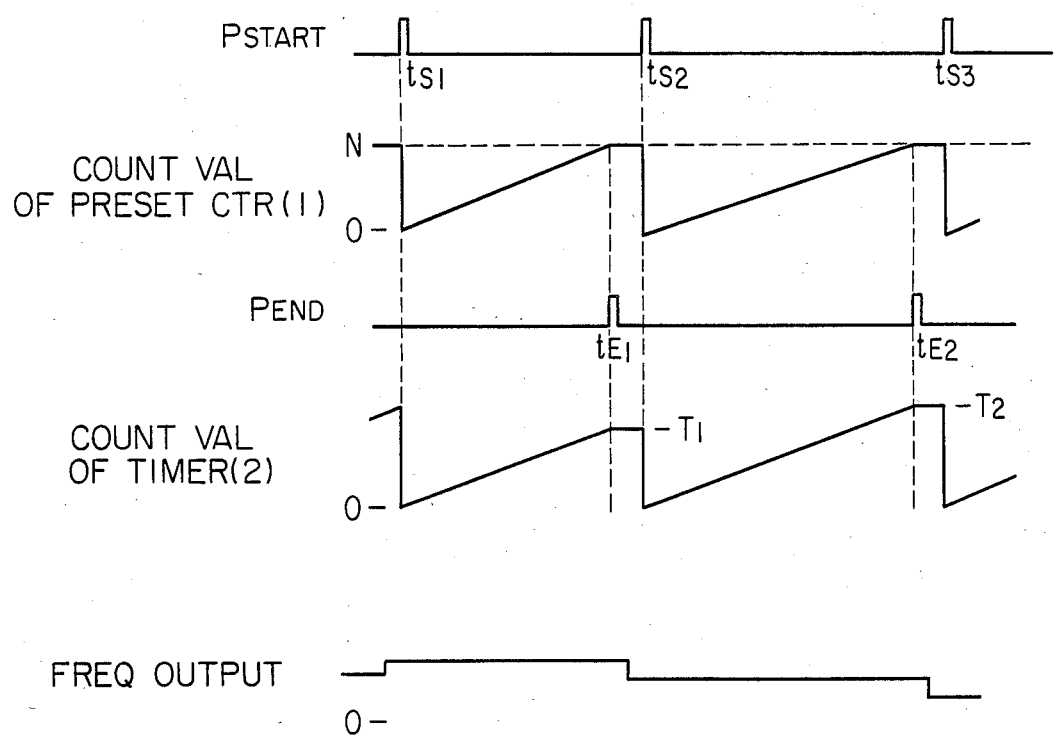
FIG. 1B is an operating waveform diagram thereof.

Now, an embodiment of this invention will be described with reference to the drawings.

In FIG. 2, numeral 4 designates a clock generator, which delivers a pulse train of frequency $F_x$ as its output. Numeral 5 designates a rate multiplier, which is exemplified as consisting of 16 bits. The output pulses of frequency $F_B$ of the rate multiplier 5 is a function of its inputs $M_0-M_{15}$ and the frequency $F_x$. That is:

$$F_B = F_x \times \frac{1}{2^{16}} \sum_{i=0}^{15} M_i \cdot 2^i$$

where M: logical value "1" or "0" of the inputs $M_0-M_{15}$, i: 0-15.

The relations between the inputs $M_0-M_{15}$ and the output pulses of frequency $F_B$ in the case of assuming the frequency $F_x$ of the clock generator 4 to be 65536 are listed in FIG. 3. Numeral 6 in FIG. 2 indicates a first up/down counter, the UP input of which is supplied with pulses to-be-measured of frequency $F_{IN}$ and the DOWN input of which is supplied with the output pulses of frequency $F_B$ of the rate multiplier 5. The first up/down counter 6 integrates the differences between its input pulses of frequencies $F_{IN}$ and $F_B$. More specifically, in case of $F_{IN} > F_B$, the counter 6 counts up, and it generates a carry output C each time an overflow arises. In case of $F_{IN} < F_B$, it counts down, and it generates a borrow output B each time an underflow arises. In case of $F_{IN} = F_B$, it repeats the countup and coundown alternately and generates neither the carry output C nor the borrow output B. Shown at numeral 7 is a second up/down counter, the UP input of which is supplied with the carry output C of the first up/down counter 6 and the DOWN input of which is supplied with the borrow output B. Likewise to the first up/down counter 6, the second up/down counter 7 integrates the differences between its UP signals and DOWN inputs. The instantaneous value of the integration is delivered as a binary number which is expressed by the combination of the logical values "1" or "0" of outputs $Q_0-Q_{11}$.

Numeral 8 indicates a ROM (read only memory), the address inputs $A_0-A_{11}$ of which are respectively supplied with the outputs $Q_0-Q_{11}$ of the second up/down counter 7. Data appointed by the address inputs $A_0$–$A_{11}$ are delivered to data outputs $\phi_0$–$\phi_{15}$. In the illustrated case of FIG. 2, the ROM 8 has the address inputs of 12 bits and the data outputs of 16 bits. That is, this ROM can generate data of 16 bits in a number of $2^{12} = 4096$. The output data $\phi_0$–$\phi_{15}$ of the ROM 8 are applied to the inputs $M_0$–$M_{15}$ of the rate multiplier 5, and then simultaneously used as a frequency output.

Letting A denote the input value of the address inputs $A_0$–$A_{11}$ of the ROM 8, this ROM is programed so that the relationship between the value A and the data output $\phi$ may become as given by the following formula:
$\phi = m^A$
where
$\phi$: data output value of the ROM 8,
A: address input value of the ROM 8,
m: value determined by selecting the maximum value $\phi m$ of $\phi$ and the maximum value $Am$ of A, that is, $$\ln m = \frac{\ln \phi m}{Am}$$

holds from above.

FIG. 4 lists some relations between the address inputs A and the data outputs $\phi$ in the case of selecting $\phi m = 65535$ and $Am = 4095$. The data outputs $\phi$ of the ROM 8 are applied to the inputs M of the rate multiplier 5 so as to control the output frequency $F_B$. A closed loop which is constructed of the rate multiplier 5, first up/down counter 6, second up/down counter 7 and ROM 8 acts so as to equalize the frequencies $F_{IN}$ and $F_B$. The output $\phi$ of the ROM 8 at the time at which the frequencies $F_{IN}$ and $F_B$ have equalized is a function of $F_B$ and $F_{IN}$, and is therefore used as the frequency output.

Figure 5:
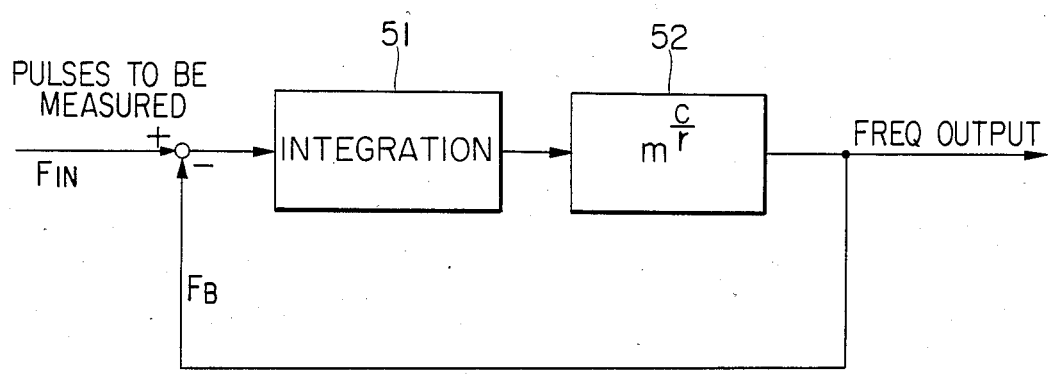
FIG. 5 is a simplified block diagram of the digital frequency meter embodying this invention.

FIG. 5 shows the closed loop as an equivalent block diagram. A block 51 represents the combined function of the first up/down counter 6 and second up/down counter 7, and indicates integrating the differences between $F_{IN}$ and $F_B$. A block 52 represents the combined function of the ROM 8 and rate multiplier 5.

In the block 52, letter r indicates the count capacity of the first up/down counter 6. Each time the integrated value of the differences between the UP inputs ($F_{IN}$) and DOWN inputs ($F_B$) becomes r, the carry output C or borrow output B is generated. Letter c indicates the instantaneous value of the integrated value of the second up/down counter 7.

Figure 6:
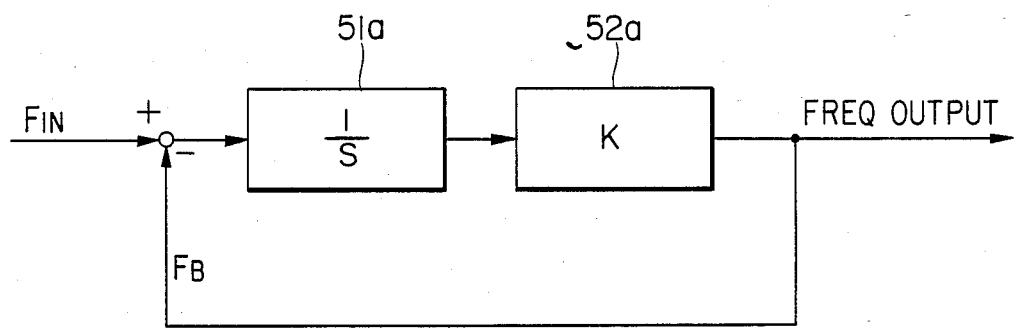
FIG. 6 is a block diagram illustrative of the response characteristics of the digital frequency meter embodying this invention.

FIG. 6 shows a block diagram of a transfer function in which the block diagram of FIG. 5 is expressed by the Laplace function. A block 51a expresses the block 51 as the Laplace function, and a block 52a the block 52. Letter K indicates the instantaneous value of $m^{c/r}$.

In FIG. 6, the transfer characteristic from the frequency $F_{IN}$ to the frequency output is given by the following formula:

$$\frac{\text{Frequency output}}{F_{IN}}(S) = \frac{\left(\frac{1}{S} \times K\right)}{1 + \left(\frac{1}{S} \times K\right)}$$

$$= \frac{K}{S + K}$$

The frequency output of the steplike change of $F_{IN}$ is given by the following formula:

$$\text{Frequency output }(S) = \frac{\text{Frequency output}}{F_{IN}}(S) \times F_{IN}(S)$$

$$= \frac{K}{S + K} \times \frac{F_{IN}}{S}$$

When this is subjected to the inverse Laplace transform, the frequency output expressed as a time function is given by the following formula:

$$\text{Frequency output }(t) = F_{IN}(1 - e^{-kt})$$

Thus, it is understood that the frequency output responds to the step change of the input $F_{IN}$ with a time constant $= 1/K$, which is the inverse value of the gain K of the block 52a. In addition, the gain K is expressed by the ratio of the change of $F_B$ to the change of $F_{IN}$, that is, $$K = \frac{\Delta F_B}{\Delta F_{IN}}.$$

Since the gain K expresses the instantaneous value of $m^{c/r}$ as stated before, it changes depending upon the value of c. Accordingly, the time constant changes depending upon the value of c.

Now, the variation $\Delta F_B$ of $F_B$ with respect to the variation $\Delta F_{IN} = 1$ of $F_{IN}$ will be evaluated. Since the input $F_{IN}$ has been diminished to $1/r$ by the first up/down counter 6, the variation $\Delta F_B$ is given by the following formula:

$$\Delta F_B = (m)^{\frac{c+1}{r}} - (m)^{\frac{c}{r}}$$

Since the instantaneous value of the gain is $\Delta F_{IN} = 1$, it is expressed by the following formula:

$$K = \frac{\Delta F_B}{1} = (m)^{\frac{c+1}{r}} - (m)^{\frac{c}{r}}$$

Accordingly, the time constant $\tau$ at this time is expressed by the following formula:

$$\tau = \frac{1}{K}$$

$$= \frac{1}{(m)^{\frac{c+1}{r}} - (m)^{\frac{c}{r}}}$$

$$= \frac{1}{(m)^{\frac{c}{r}}\left(m^{\frac{1}{r}} - 1\right)}$$

On the other hand, since $F_B = (m)^{c/r}$ is set, $\tau$ is also expressed as follows:

$$\tau = \frac{1}{F_B\left(m^{\frac{1}{r}} - 1\right)}$$

It is also understood that the time constant $\tau$ is inversely proportional to $F_B$ because $$\left(m^{\frac{1}{r}} - 1\right)$$

is a constant. That is, at the equilibrium point of the closed loop, the time constant of this closed loop is inversely proportional to the frequency of the pulses to-be-measured.

Meanwhile, it is known that a statistical deviation $\sigma$ at the measurement of radiation with a frequency meter is given by the following formula:

$$\tau = \frac{1}{\sqrt{2 \cdot \lambda \cdot n}}$$

where
  $\tau$: time constant of the frequency meter,
  n: frequency of the pulses to be measured.
Since $F_B$ is proportional to the frequency n of the pulses to-be-measured, $$\tau \cdot n \propto \frac{1}{\left(m^{\frac{1}{r}} - 1\right)}$$

holds, and this becomes a constant value irrespective of the frequency. It is accordingly understood that the frequency output whose statistical deviation is constant irrespective of the frequency is obtained. By setting r variably, the statistical deviation can be varied.

As set forth above, according to this invention, the time constant of a frequency meter is inversely proportional to the frequency. This brings forth the effect that a digital frequency meter whose statistical deviation is constant irrespective of the frequency and whose frequency output changes continuously is provided.

What is claimed is:

1. A digital frequency meter for measuring frequencies of radiation pulses comprising:
   (a) a first up/down counter means having an up input connected to receive said radiation pulses and a down input converted to receive feedback pulses and producing outputs representing the integrated differences between frequencies of said radiation pulses and frequencies of said feedback pulses;
   (b) a second up/down counter means having an up input and a down input connected in cascade to receive the outputs of said first up/down counter means, and generating outputs representing the integrated differences therebetween;
   (c) arithmetic circuit means connected to receive said outputs of said second up/down counter means, and producing outputs proportional thereto;
   (d) frequency generator circuit means connected to receive the outputs of said arithmetic circuit means and generating feedback pulses having frequencies proportional to said arithmetic circuit means outputs;
   (e) connections for transmitting said feedback pulses to said down input of said first up/down counter means; and
   (f) said first and second counter means, arithmetic circuit means and frequency generator circuit means forming a closed loop for equalizing said frequencies of said radiation pulses and said frequencies of said feedback pulses and providing a frequency meter time constant which is inversely proportional to said frequencies of said radiation pulses and a constant product between said frequencies of said radiation pulses and said time constant of said meter.

2. A digital frequency meter according to claim 1 wherein said time constant of said frequency meter can be variably set by altering a count capacity of said first up/down counter.

* * * * *